(12) United States Patent
Muenz

(10) Patent No.: US 9,899,466 B2
(45) Date of Patent: Feb. 20, 2018

(54) HEAD RESISTANCE BUFFER

(71) Applicant: Texas Instruments Deutschland GMBH, Freising (DE)

(72) Inventor: Josef Muenz, Munich (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/335,818

(22) Filed: Oct. 27, 2016

(65) Prior Publication Data
US 2017/0179218 A1 Jun. 22, 2017

Related U.S. Application Data

(60) Provisional application No. 62/269,297, filed on Dec. 18, 2015.

(51) Int. Cl.
*H01L 27/02* (2006.01)
*H01L 49/02* (2006.01)

(52) U.S. Cl.
CPC .......... *H01L 28/20* (2013.01); *H01L 27/0207* (2013.01)

(58) Field of Classification Search
CPC .............................. H01L 27/0207; H01L 28/20
See application file for complete search history.

(56) References Cited

U.S. PATENT DOCUMENTS 5,466,484 A * 11/1995 Spraggins ................ G01K 7/22
257/529
7,030,728 B2 * 4/2006 Thei ....................... H01C 7/006
257/E21.004

* cited by examiner

*Primary Examiner* — Whitney T Moore
*Assistant Examiner* — Joseph Galvin, III
(74) *Attorney, Agent, or Firm* — Jacqueline J. Garner; Charles A. Brill; Frank D. Cimino

(57) ABSTRACT

An integrated circuit with first and second resistors comprised of resistor bodies, resistor heads, and resistor buffer regions wherein the resistor buffer regions are disposed between the resistor body and the resistor heads. The width of the first and second resistors is different. The length of the first and second resistor buffer regions is different. The total head resistance which is equal to the resistor head resistance plus the resistor buffer region is equal for both the first and second resistors. A method is described for forming an integrated circuit with first and second resistors comprised of resistor bodies, resistor heads, and resistor buffer regions disposed between the resistor body and the resistor head wherein the width of the first and second resistors is different, wherein the length of the resistor buffer regions of the first and second resistors is different, and wherein the total head resistance which is equal to the resistor head resistance plus the resistor buffer region is equal for both the first and second resistors. A method is described for calculating the length of a resistor buffer region as a function of resistor width so that the resistance of the resistor head plus the resistor buffer region remains the same as resistor body width changes.

10 Claims, 7 Drawing Sheets

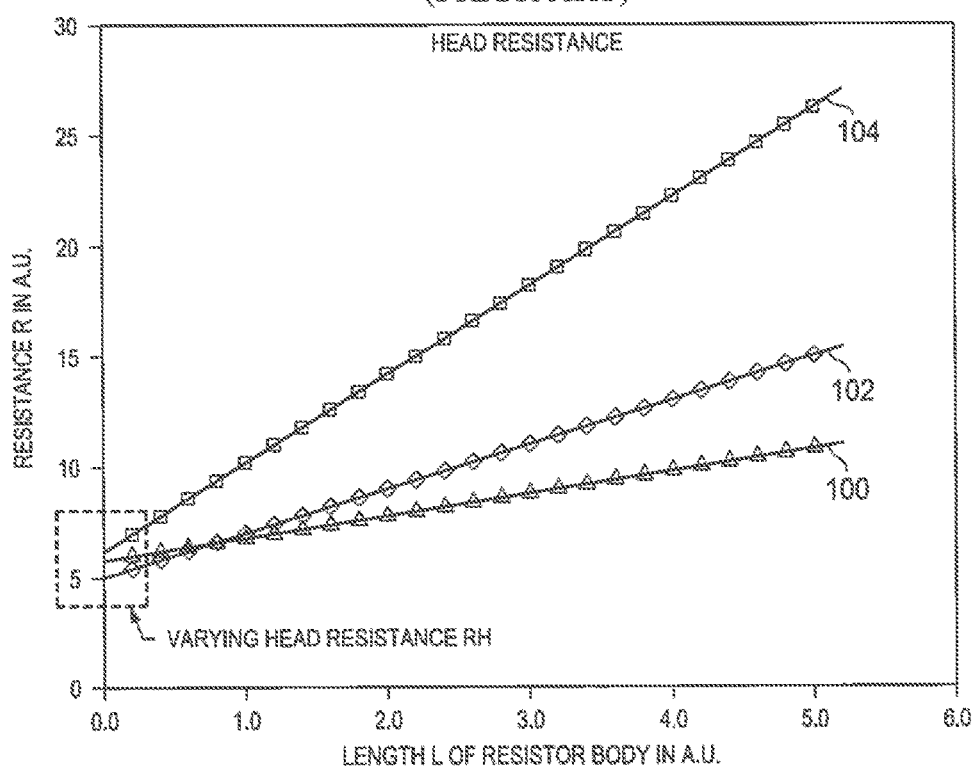

| $R_{HB}$ IN OHM*µm | 1.0 | 1.2 | 1.4 |
|---|---|---|---|
| $W_R$ IN µm | $L_B$ IN µm | $L_B$ IN µm | $L_B$ IN µm |
| 0.40 | 0.49 | 0.64 | 0.79 |
| 0.50 | 0.56 | 0.73 | 0.89 |
| 0.60 | 0.63 | 0.80 | 0.97 |
| 0.70 | 0.68 | 0.87 | 1.05 |
| 0.80 | 0.73 | 0.93 | 1.13 |
| 0.90 | 0.78 | 0.99 | 1.20 |
| 1.00 | 0.82 | 1.04 | 1.26 |
| 1.10 | 0.86 | 1.09 | 1.32 |
| 1.20 | 0.90 | 1.14 | 1.38 |
| 1.30 | 0.93 | 1.18 | 1.44 |
| 1.40 | 0.96 | 1.23 | 1.49 |
| 1.50 | 0.99 | 1.27 | 1.54 |
| 1.60 | 1.02 | 1.31 | 1.59 |

HEAD RESISTANCE BUFFER

CROSS REFERENCE TO RELATED APPLICATIONS

This application claims the benefit of U.S. Provisional Application Ser. No. 62/269,297, filed Dec. 18, 2015, the contents of which is herein incorporated by reference in its entirety.

FIELD

This invention relates to the field of integrated circuits. More particularly, this invention relates to resistors formed in integrated circuits.

BACKGROUND

Resistors such as are described in FIGS. 1A, 1B, and 1C are frequently formed in integrated circuits (IC). They typically are comprised of a resistor body 100, 102, and 104 with a resistor head 110 at each end to which electrical contact is made. The IC resistors may be formed using a well in the substrate, may be formed by gate material such as polysilicon or metal, may be formed using implanted n-type or p-type diffusions, or may be formed using a variety of metals in the interconnection layers.

The resistors 100, 102, and 104, shown in FIG. 1A, 1B, 1C, may be formed with the same resistor length 122 or with different resistor lengths, $L_R$. The hundreds or thousands of resistors that are formed in an integrated circuit typically have a variety of different resistor widths, 114, 116, 118.

It is desirable for the total resistance $R_T$ (body resistance plus head resistance) to vary linearly with the length $L_R$ and linearly with $1/W_R$ which is the inverse of the resistor width $W_R$. Ideally when the resistor body length $L_{RB}$ is zero, the total resistance $R_T$ would be equal to the resistor head resistance $R_H$. Since the resistor heads 110 are identical for the three resistors 100, 102, 104 in FIGS. 1A, 1B, and 1C when the length of the three resistor bodies $L_{RB}$ is extrapolated to zero the head resistances $R_H$ should be the same. As shown in FIG. 2 this is not the case for the resistors depicted in FIGS. 1A, 1B, and 1C.

This discrepancy may cause circuit simulation programs which assume ideal behavior to calculate an incorrect result. This may cause the circuit to fail or may result in a reduction in the design space with a corresponding reduction in IC yield.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit with first and second resistors comprised of resistor bodies, resistor heads, and resistor buffer regions wherein the resistor buffer regions are disposed between the resistor body and the resistor heads. The width of the first and second resistors is different. The length of the first and second resistor buffer regions is different. The total head resistance which is equal to the resistor head resistance plus the resistor buffer region is equal for both the first and second resistors. A method is described for forming an integrated circuit with first and second resistors comprised of resistor bodies, resistor heads, and resistor buffer regions disposed between the resistor body and the resistor head wherein the width of the first and second resistors is different, wherein the length of the resistor buffer regions of the first and second resistors is different, and wherein the total head resistance which is equal to the resistor head resistance plus the resistor buffer region is equal for both the first and second resistors. A method is described for calculating the length of a resistor buffer region as a function of resistor width so that the resistance of the resistor head plus the resistor buffer region remains the same as resistor body width changes.

DESCRIPTION OF THE VIEWS OF THE DRAWINGS

FIG. 2 (Prior art) is a graph of resistance versus length for the resistors in FIGS. 1A, 1B, and 1C.

DETAILED DESCRIPTION OF EXAMPLE EMBODIMENTS

Embodiments of the invention are described with reference to the attached figures. The figures are not drawn to scale and they are provided merely to illustrate the invention. Several aspects of the embodiments are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The embodiments are not limited by the illustrated ordering of acts or events, as some acts may occur in different orders and/or concurrently with other acts or events. Furthermore, not all illustrated acts or events are required to implement a methodology in accordance with the present invention.

Figure 1A:
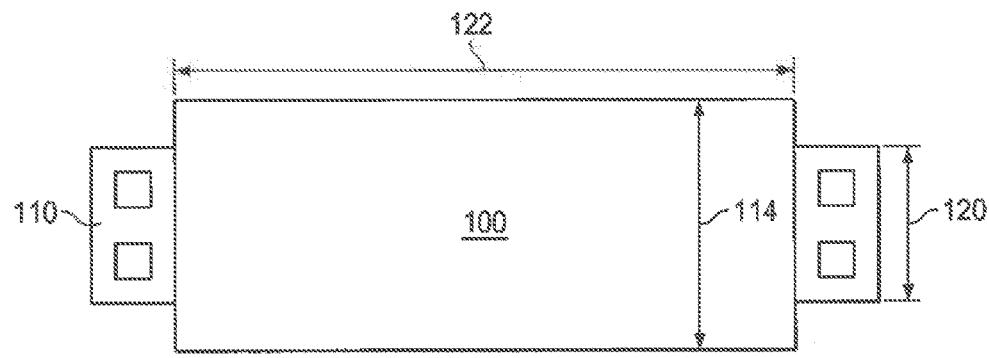
FIGS. 1A, 1B, and 1C (Prior art) are plan views of integrated circuit resistors.
Figure 1B:
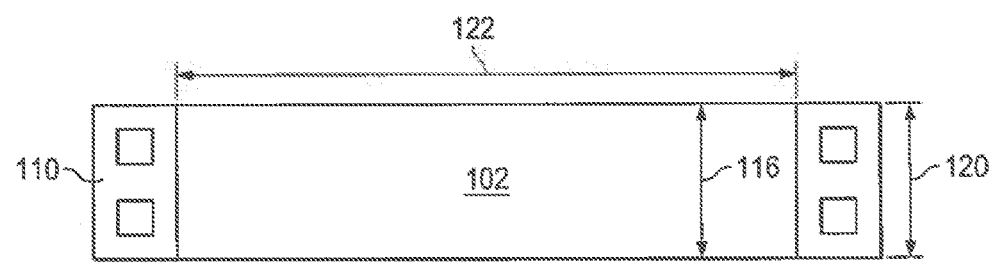
Figure 1C:
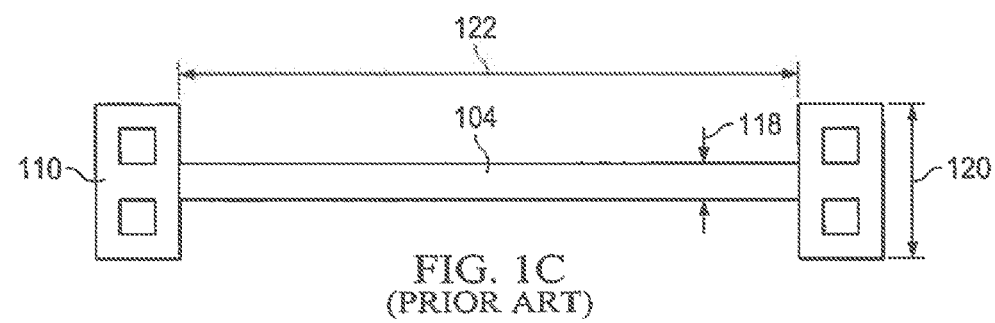
Figure 3A:
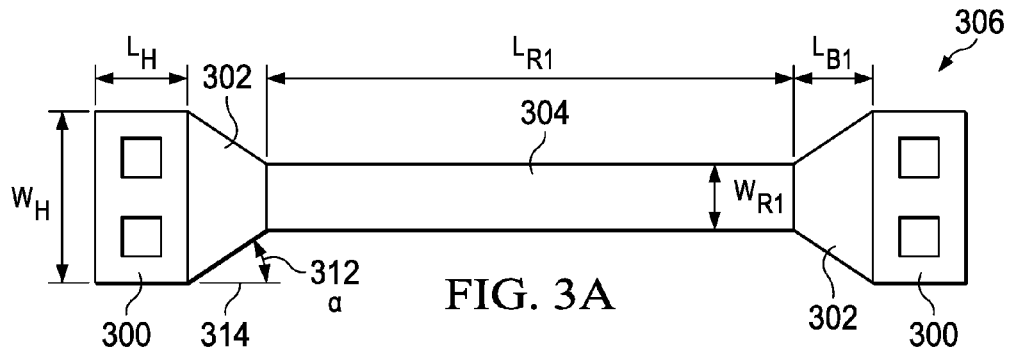
FIGS. 3A, 3B, and 3C are a plan views of embodiment resistors formed using the principles of the invention
Figure 3B:
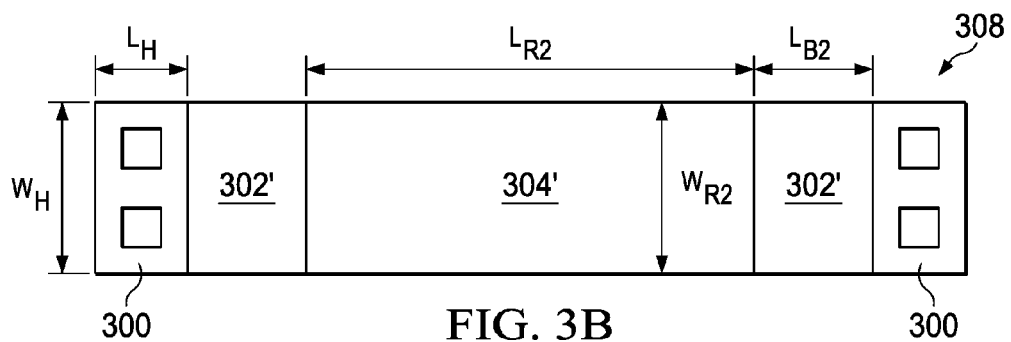
Figure 3C:
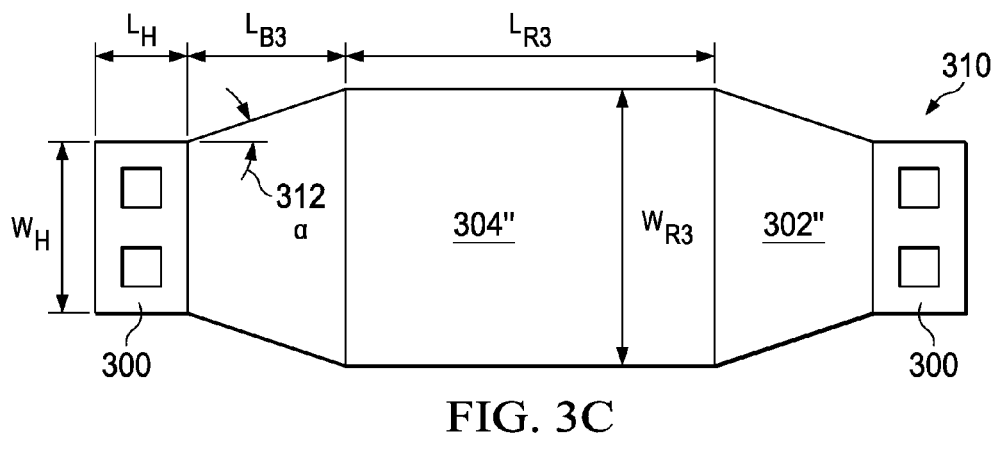

Example embodiment resistors are illustrated in FIGS. 3A, 3B, 3C. The embodiment resistors 306, 308, 310 are comprised of identical resistor head regions 300, resistor body regions 304, 304', and 304" of different widths, and resistor buffer regions 302, 302', and 302" of different lengths. Resistor 306 has a first body width $W_{R1}$ and a first buffer region length $L_{B1}$. Resistor 308 has a second body width $W_{R2}$ different from the first body width $W_{R1}$ and a second buffer region length $L_{B2}$ different from the first buffer region length $L_{B1}$. Resistor 310 has a third body width $W_{R3}$ different from the first body width $W_{R1}$ and the second body width $W_{R2}$ and a third buffer region length $L_{B3}$ different from the first buffer region length $L_{B1}$ and the second buffer region length $L_{B2}$.

The resistor buffer regions 302, 302', and 302" of different lengths ensure that the total head resistance, $R_{HB}$, ($R_{HB}=R_H+R_B$) remains constant as the width $W_R$ of the embodiment resistor body changes.

Figure 4:
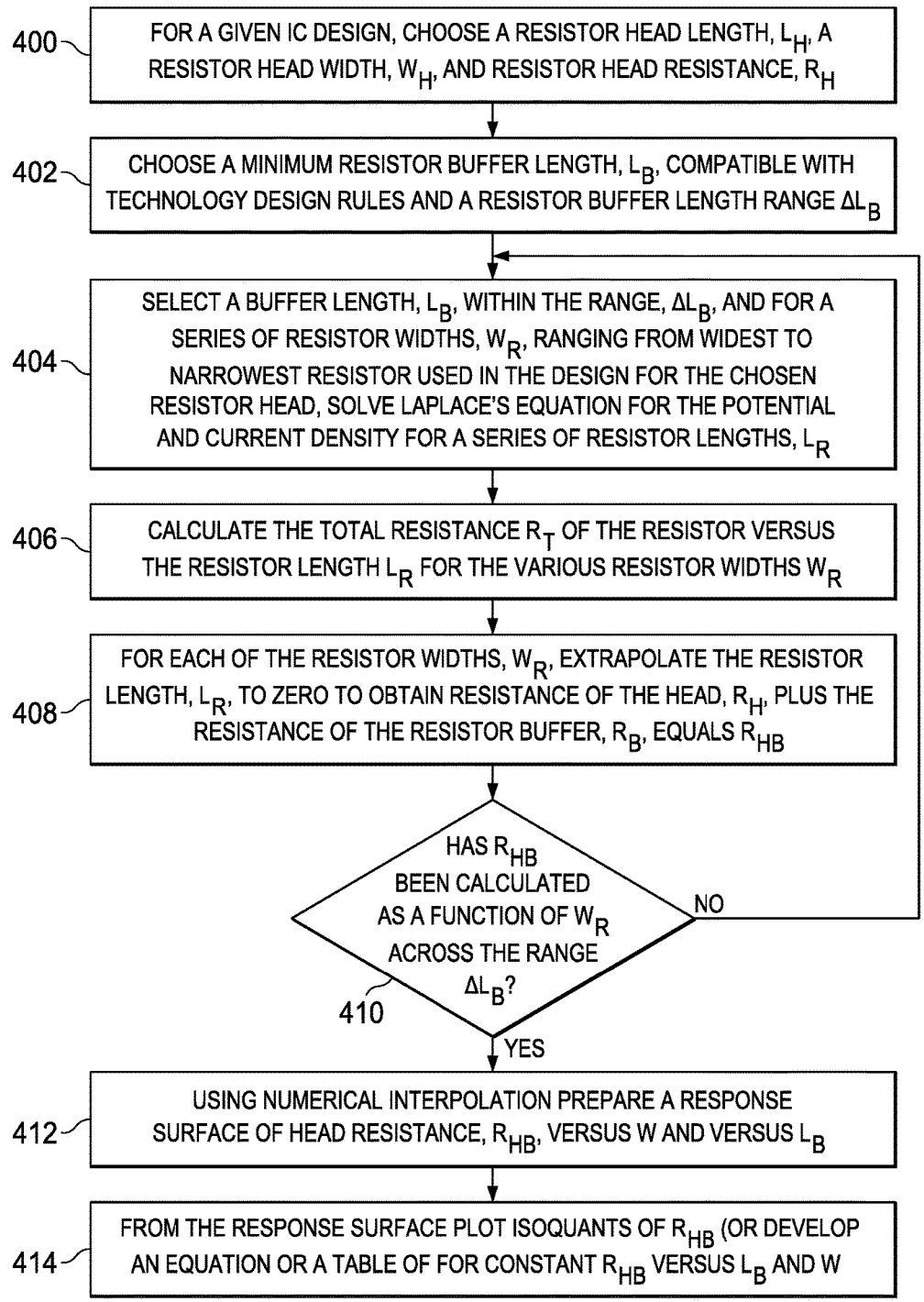
FIG. 4 is a flow diagram illustrating steps in the calculation for determining resistor buffer length.

A method for forming the embodiment resistors is described in the flow diagram in FIG. 4. The method is illustrated using the same resistor head layout with the same head resistance for all resistors in a given IC design. Multiple head resistances may be used if desired. For example, in regions of the IC where area is limited a small resistor head 300 with high head resistance may be used and in regions of the IC where area is not limited a large resistor head 300 with low head resistance may be used.

In step 400 for a given IC design and technology a resistor head layout is chosen and the resistance, $R_H$, of the resistor head is characterized.

In step 402 a resistor buffer length range, $\Delta L_B$, is chosen compatible with the technology design rules. For example the angle 312, $\alpha$, between the buffer region 302 and a line parallel to the length of the resistor 314 may be limited to a maximum negative or positive angle $\alpha$ by the technology design rules. It is desirable to keep the length of the resistor buffer region, $L_B$, to a minimum to keep the total head resistance $R_{HB}$ (head resistance plus buffer region resistance) as small as possible. The range of the resistor buffer region lengths, $\Delta L_B$ may be determined by calculating the maximum resistor buffer length needed to satisfy the requirement that $R_{HB}$ remains constant over the range of resistor lengths $L_R$ and resistor widths $W_R$ used in the integrated circuit (IC).

In step 404 a resistor buffer length is selected, $L_B$, and for a series of resistor widths, $W_R$, that will be used in the IC, Laplace's equation is solved for the electrical potential, $\Phi$, for a series of resistor lengths, $L_R$.

$$\Delta\Phi = \frac{\partial^2 \varphi}{\partial x^2} + \frac{\partial^2 \varphi}{\partial y^2} = 0$$

Figure 5:
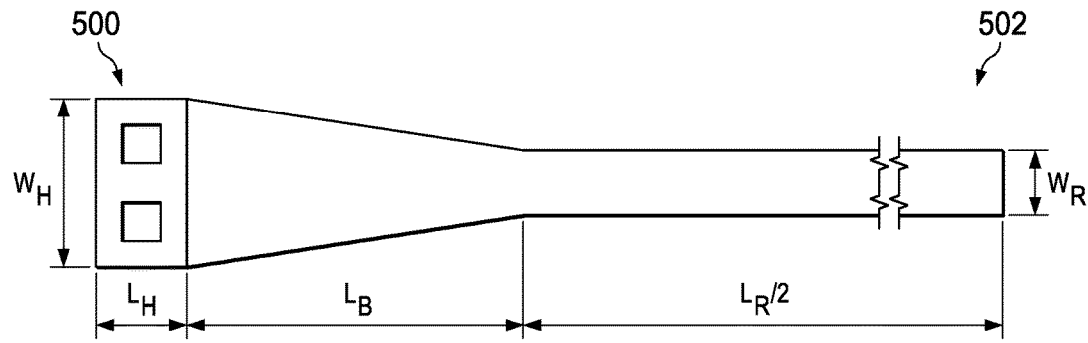
FIG. 5 is a plan view of a half resistor used for calculating resistor buffer length.

To save computational time, Laplace's equation may be solved for half of the resistor as shown in FIG. 5. Boundary conditions for the equation may be a power supply voltage, Vdd, applied to the resistor head 500, and Vdd/2 applied to the end 502 of the half resistor.

The electric field, E, and current density, J, may then be calculate using the following equations:

$$E = -\nabla\Phi$$

$$J = \sigma E$$

where $\sigma$ is the conductivity of the resistor material.

In step 406 the total resistance $R_T$ (resistor head+resistor buffer region+½ the length of the resistor) may be calculated for different resistor lengths, $L_R$, using the equation:

$$R_T(L_R) = \frac{Vdd}{\int J\left(\frac{L_R}{2}\right) dA}$$

where dA is the differential cross sectional area of the resistor.

In step 408, for each of the resistor body widths, $W_R$, the resistance of the total resistor head resistance, $R_{HB}$, is found by extrapolating the resistor body length, $L_R$, to zero.

$$R_{HB} = \frac{1}{2} \lim_{L_R \to 0} R(L_R)$$

In step 410, a check is performed to determine if the total head resistance $R_{HB}$ has been evaluated across the range of resistor body widths $W_R$ and across the range of resistor buffer lengths $L_B$ that may be used in the IC layout. If the answer is no, the program returns to step 404 to select another buffer length $L_B$ and repeat the calculations in steps 408 and 410 for the new buffer length $L_B$.

Figure 6:
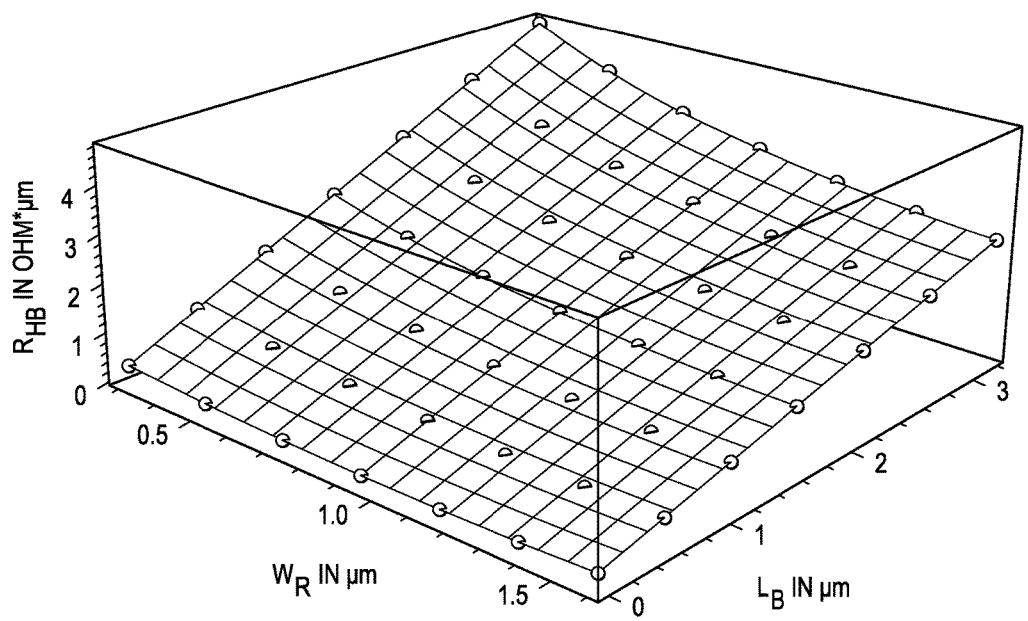
FIG. 6 is a response surface of total head resistance as a function of resistor body width and resistor buffer length.

If, however, $R_{HB}$, has been calculated across the range of resistor body widths, $W_R$, and resistor buffer lengths $L_B$ the program proceeds to step 412 where numerical interpolation is used to estimate the values of total head resistance, $R_{HB}$, between the calculated points and to form a response surface of $R_{HB}$ as a function of $W_R$ and $L_B$ (See FIG. 6). This response surface covers the range of resistor body widths, $W_R$, used in the IC design layout and the range of buffer lengths, $\Delta L_B$, needed to keep the total head resistance, $R_{HB}$, constant across the range of resistor body widths, $W_R$.

Figures 7, 8:
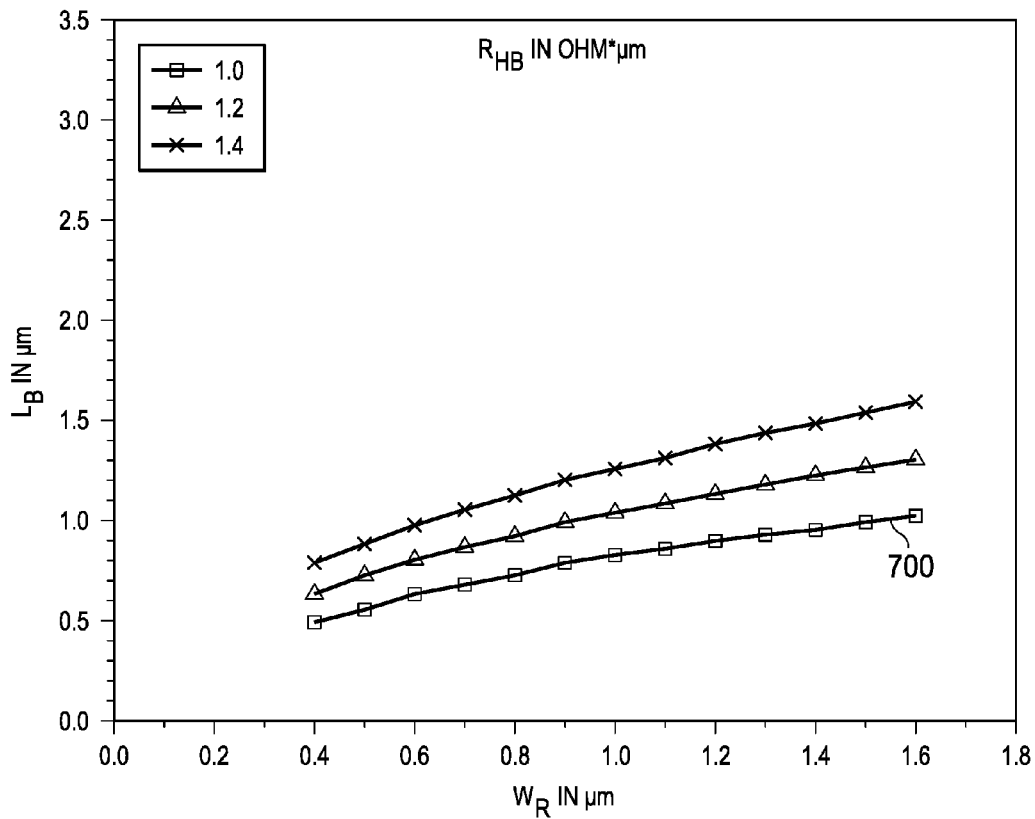
FIG. 7 is a graph of total head resistance isoquants.
FIG. 8 is a table of resistor buffer lengths for different resistor body widths for three different total head resistances.

In step 414 isoquants of $R_{HB}$ formed on the response surface may be used to prepare plots of constant $R_{HB}$ versus $L_B$ and $W_R$ as shown in FIG. 7. For example, plot 700 on the graph shows the buffer length $L_B$ the designer needs to layout for each resistor body width $W_R$ to ensure the total head resistance, $R_{HB}$, remains constant at 1.0 Ohm*µm.

Similarly isoquants of $R_{HB}$ formed in step 414 may be used to prepare a Table of $L_B$ and $W_R$ for constant $R_{HB}$ as shown in FIG. 8. For example, if the resistor body width $W_R$ is 1.0 µm, the designer needs to lay out a resistor buffer length of 0.82 µm when using a head resistance of 1.0 Ohm*µm, a resistor buffer length of 1.04 µm when using a head resistance of 1.2 Ohm*µm, or a resistor buffer length of 1.26 µm when using a head resistance of 1.4 Ohm*µm.

Alternatively an equation may be formed in which the designer inputs the total head resistance, $R_{HB}$, and the resistor body width $W_R$, and the equation outputs the resistor buffer length $L_B$ the designer needs to use when laying out the resistor.

The embodiment resistor layout and method avoids the problem of the resistor head resistance being a function of the width of the body of the resistor which may result in errors in circuit simulations and reduction in design margins.

Figure 9:
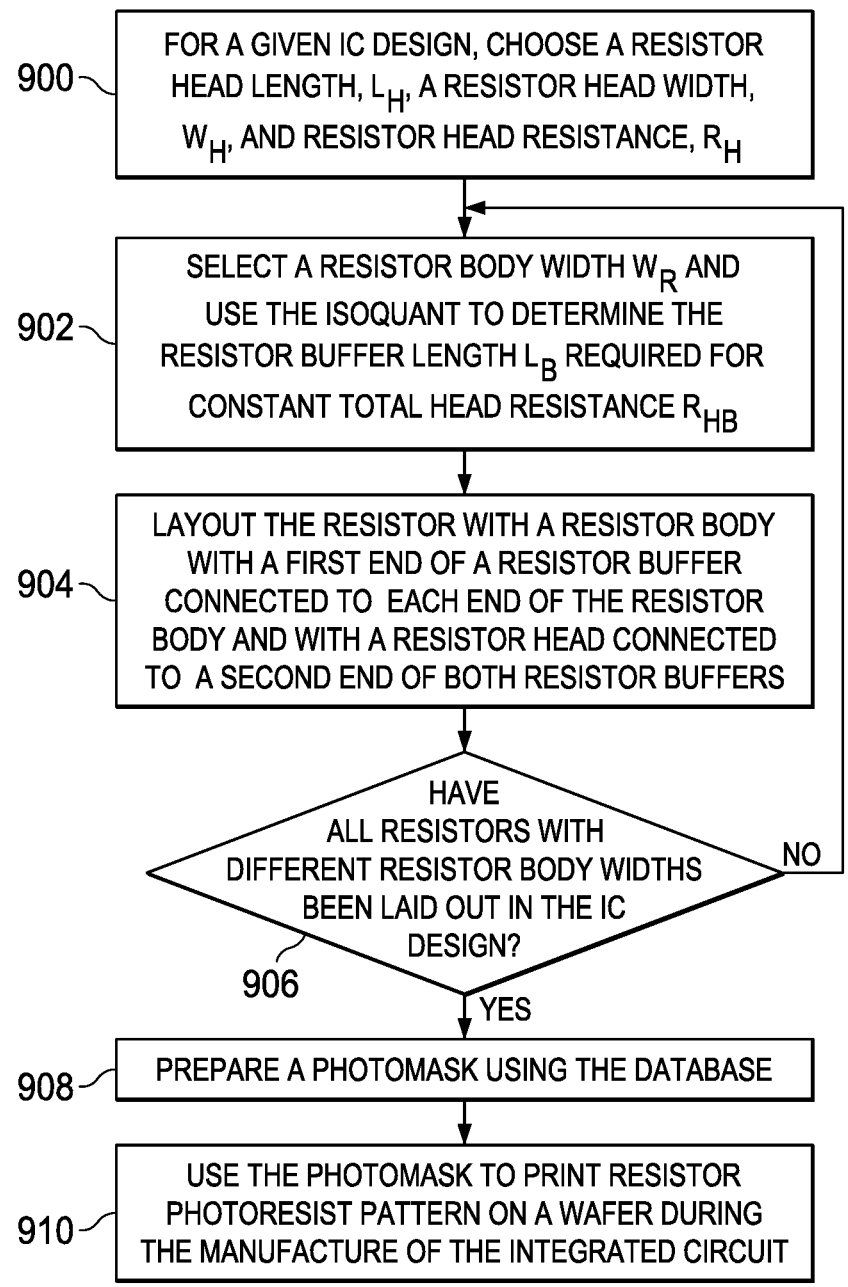
FIG. 9 is a flow diagram illustrating steps in the formation of an integrated circuit containing resistors with different resistor body widths and constant total head resistance.

A flow diagram for forming an integrated circuit with resistors that have constant total head resistance $R_{HB}$ (resistor head resistance plus resistor buffer region resistance) is shown in FIG. 9.

In step 900 a standard resistor head layout with a fixed head resistance $R_H$ is chosen for all resistors in the integrated circuit. If desired, more than one resistor head layout with different head resistances may be used. In such a case the flow diagram would be followed separately for each of the different head resistances.

In step 902 a resistor buffer length $L_B$ that corresponds to a resistor body width $W_R$ is selected so that the total head resistance $R_{HB}$ remains constant.

In step 904 the resistor is laid out in the database of the integrated circuit. The resistor is comprised of a resistor body with width, $W_R$, resistor buffer regions with length $L_B$ connected to each end of the resistor body and resistor heads attached to the resistor buffer regions. Typically the width of the end of the resistor buffer region connected to the resistor head is equal to the width of the resistor head $W_H$ and the width of the end of the resistor buffer region connected to the resistor body is equal to the width of the resistor body $W_R$. When a voltage is applied across the resistor, current flows into the first resistor head, through the first resistor buffer region, through the resistor body, through the second resistor buffer region, and out of the second resistor head.

In step 906 the data base is checked to determine of resistors for all the different resistor body widths $W_R$ have been laid out. If not all have been laid out steps 902 and 904 are repeated until all resistors with different body widths have been laid out in the IC database.

If, however, all resistors have been laid out, as illustrated in step 908 the data base is used to prepare a photomask with the resistor geometries.

In step 910 this photomask is used to print the resistor photoresist patterns on wafers during the manufacture of an integrated circuit.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
    a first resistor comprising:
        a first resistor body with a first body width;
        a first resistor buffer region at a first end of the first resistor body and a second resistor buffer region at a second end of the first resistor body, the first and second resistor buffer regions each having a first buffer length;
        a first resistor head separated from the first resistor body by the first resistor buffer region and a second resistor head separated from the first resistor by the second resistor buffer region, the first and second resistor heads each having a head width and a head length;
    a second resistor comprising:
        a second resistor body with a second body width different from the first body width;
        a third resistor buffer region at a first end of the second resistor body and a fourth resistor buffer region at a second end of the second resistor body, the third and fourth resistor buffer regions each having a second buffer length different from the first buffer length;
        a third resistor head separated from the second resistor body by the third resistor buffer region and a fourth resistor head separated from the second resistor by the fourth resistor buffer region, the third and fourth resistor heads each having said head width and said head length;
    wherein the resistance of the first resistor head plus the first buffer region is equal to the resistance of the third resistor head plus the third buffer region.

2. The integrated circuit of claim 1, wherein:
    a width of a first end of the first buffer region is equal to the first body width;
    a width of a second end of the first buffer region is equal to the head width;
    a width of a first end of the third buffer region is equal to the second body width; and
    a width of the second end of the third buffer region is equal to the head width.

3. The integrated circuit of claim 1, wherein the first and second resistors are well resistors.

4. The integrated circuit of claim 1, wherein the first and second resistors are diffusion resistors.

5. The integrated circuit of claim 1, wherein the first and second resistors are polysilicon resistors.

6. The integrated circuit of claim 1, wherein the first and second resistors are metal resistors.

7. A method of fabricating an integrated circuit comprising:
    forming a first resistor by:
        forming a first resistor body with a first body width;
        forming a first resistor buffer region at a first end of the first resistor body and a second resistor buffer region at a second end of the first resistor body, the first and second resistor buffer regions each having a first buffer length; and
        forming a first resistor head separated from the first resistor body by the first resistor buffer region and a second resistor head separated from the first resistor by the second resistor buffer region, the first and second resistor heads each having a head width and a head length; and
    forming a second resistor by:
        forming a second resistor body with a second body width different from the first body width;
        forming a third resistor buffer region at a first end of the second resistor body and a fourth resistor buffer region at a second end of the second resistor body, the third and fourth resistor buffer regions each having a second buffer length different from the first buffer length; and
        forming a third resistor head separated from the second resistor body by the third resistor buffer region and a fourth resistor head separated from the second resistor by the fourth resistor buffer region, the third and fourth resistor heads each having said head width and said head length;
    wherein the resistance of the first resistor head plus the first buffer region is equal to the resistance of the third resistor head plus the third buffer region.

8. The method of claim 7, wherein said first resistor body, said first and second resistor buffer regions, said first and second resistor heads, said second resistor body, said third and fourth resistor buffer regions and said third and fourth resistor heads comprise polysilicon.

9. The method of claim 7, wherein said first resistor body, said first and second resistor buffer regions, said first and second resistor heads, said second resistor body, said third and fourth resistor buffer regions and said third and fourth resistor heads comprise a same metal material.

10. The method of claim 7, wherein said first resistor body, said first and second resistor buffer regions, said first and second resistor heads, said second resistor body, said third and fourth resistor buffer regions and said third and fourth resistor heads each comprise a doped region of a substrate.

* * * * *